United States Patent
Hsieh

(10) Patent No.: US 6,737,199 B1
(45) Date of Patent: May 18, 2004

(54) USING NEW PATTERN FRACTURING RULES FOR OPTICAL PROXIMITY CORRECTION MASK-MAKING TO IMPROVE CRITICAL DIMENSION UNIFORMITY

(75) Inventor: Ren-Guey Hsieh, Ping-Tung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/494,637

(22) Filed: Jan. 31, 2000

(51) Int. Cl.$^7$ ................................. G03F 9/00
(52) U.S. Cl. ..................... 430/5; 430/311; 430/296
(58) Field of Search ................. 430/5, 311, 296; 716/19, 21

(56) References Cited

U.S. PATENT DOCUMENTS

| | | | |
|---|---|---|---|
| 5,553,273 A | | 9/1996 | Liebmann ................. 395/500 |
| 5,723,233 A | * | 3/1998 | Garza et al. ................. 430/5 |
| 5,827,625 A | * | 10/1998 | Lucas et al. ................. 430/5 |
| 5,847,421 A | | 12/1998 | Yamaguchi ................. 257/207 |
| 5,858,591 A | | 1/1999 | Lin et al. ................. 430/30 |
| 5,862,058 A | | 1/1999 | Samuels et al. ............ 364/491 |
| 6,064,485 A | * | 5/2000 | Lin et al. ................. 356/400 |
| 6,127,071 A | * | 10/2000 | Lu ................. 430/5 |
| 6,189,136 B1 | * | 2/2001 | Bothra ................. 716/21 |
| 6,218,089 B1 | * | 4/2001 | Pierrat ................. 430/394 |
| 6,245,466 B1 | * | 6/2001 | Kotani et al. ................. 430/5 |
| 6,421,820 B1 | * | 7/2002 | Mansfield et al. ............ 716/21 |

* cited by examiner

Primary Examiner—Janet Baxter
Assistant Examiner—Amanda C. Walke
(74) Attorney, Agent, or Firm—George O. Saile; Stephen B. Ackerman; Larry J. Prescott

(57) ABSTRACT

This invention describes methods of using pattern fracture rules to form mask pattern segments and the mask for the mask pattern segments. The mask pattern segments have optical proximity correction and are separated into regular pattern elements and optical proximity correction elements. Regular fracture elements and special fracture elements are used. The special fracture elements are parallel to the regular fracture elements, perpendicular to the regular fracture elements, or both parallel to and perpendicular to the regular fracture elements. The special fracture elements are used to define the regular pattern elements and prevent the formation of resist residue in the completed mask. The optical proximity correction elements are formed using the regular fracture elements.

14 Claims, 3 Drawing Sheets

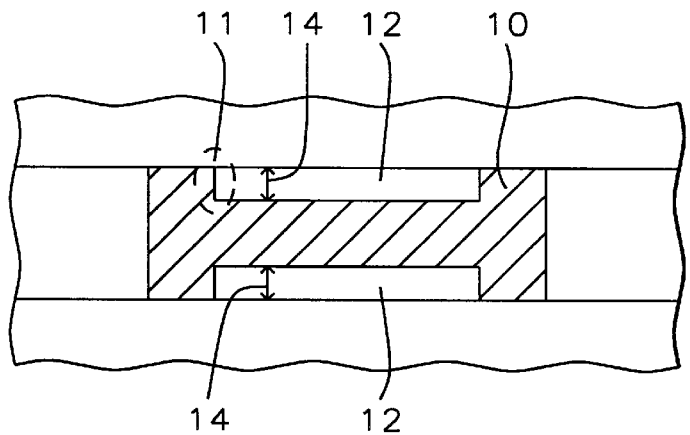
FIG. 1 – Prior Art
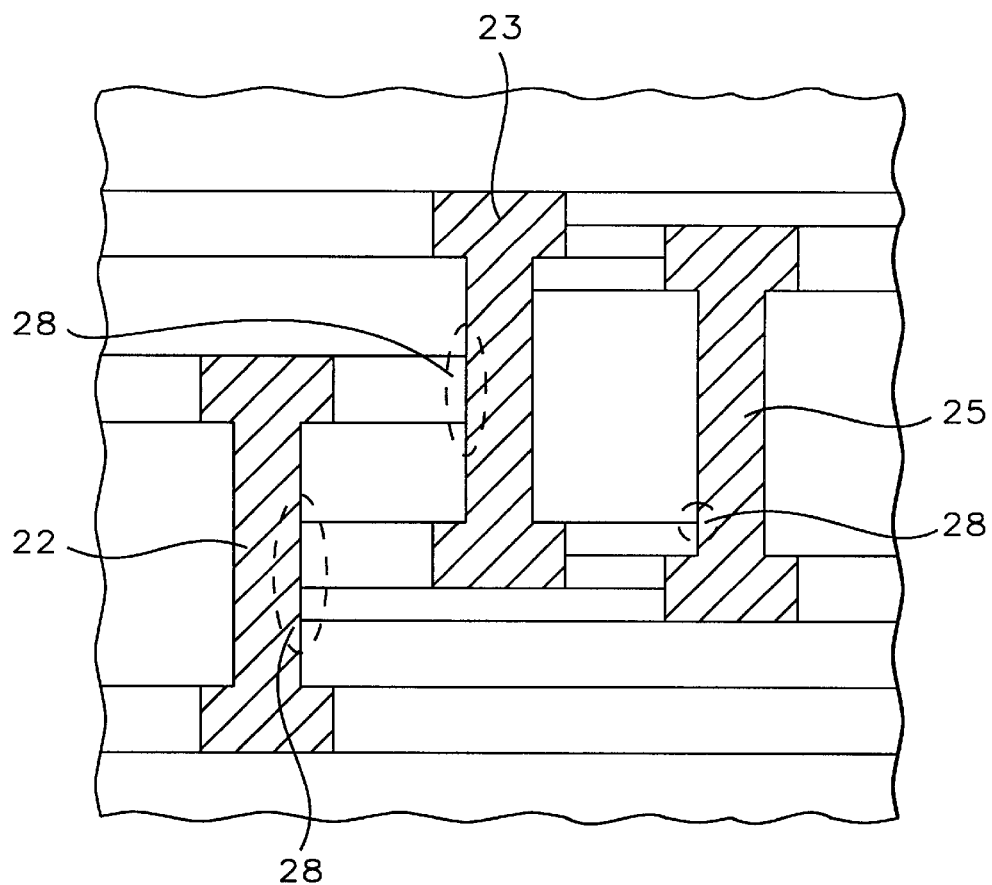
FIG. 2 – Prior Art

USING NEW PATTERN FRACTURING RULES FOR OPTICAL PROXIMITY CORRECTION MASK-MAKING TO IMPROVE CRITICAL DIMENSION UNIFORMITY

BACKGROUND OF THE INVENTION (1) Field of the Invention

This invention relates to the use of fracture patterns and pattern fracturing rules to fabricate masks having optical proximity correction.

(2) Description of the Related Art

The usual pattern fracturing rule for electron beam exposure patterns is to fracture the pattern along one direction, horizontal or vertical direction. When masks having optical proximity correction are fabricated using vector scan electron beam writers these pattern fracturing rules can cause problems, such as resist scum residue, at pattern jogs required for optical proximity correction. Multiple fracture elements perpendicular to the edge of a critical dimension line will also cause problems, such as resist scum residue.

U.S. Pat. No. 5,858,591 to Lin et al. describes a method for optical proximity correction. The method splits the full description data file into two subfiles, one subfile where the density of lines is high and one subfile where the lines tend to be isolated. A bias is then applied to the subfiles and the subfiles are merged back into a single data file.

U.S. Pat. No. 5,862,058 to Samuels et al. describe a method of optical proximity correction that allows for correction of line width deviations.

U.S. Pat. No. 5,847,421 to Yamaguchi describes a method of optical proximity correction using a basic cell library.

U.S. Pat. No. 5,553,273 to Liebman describes an optical proximity correction method which predistorts the mask while biasing only critical features and eliminating, as much as possible, the creation of additional vertices.

SUMMARY OF THE INVENTION

When masks having patterns with optical proximity correction, OPC, are fabricated pattern fracturing is often used. The pattern fracturing segments the pattern into a number of rectangular elements which can be reproduced with an electron beam pattern writer. The usual pattern fracturing rule for electron beam exposure patterns is to fracture the pattern along one direction, horizontal or vertical, as shown in FIGS. 1 and 2. This pattern fracturing rule can cause problems for vector scan electron beam writers. The vector scan electron beam writers are frequently used because they have higher throughput than other types of electron beam writers.

The vector scan electron beam writer system is shown schematically in FIG. 3. In the vector scan electron beam writer an electron beam 40 passes through a number of apertures, 36 and 38, to form a pattern on a layer of positive resist 34. The layer of positive resist 34 is formed on a layer of opaque material 32, such as chrome. The layer of opaque material 32 is formed on a transparent mask substrate 30.

FIGS. 1 and 2 show pattern fracture rules which cause problems in the fabrication of masks with the vector scan electron beam writer. In FIGS. 1 and 2 the pattern elements are cross hatched to make them more visible while the fracture elements are not cross hatched. FIG. 1 shows a fracture pattern of a pattern element 10 formed by rectangular fracture elements oriented in the same direction as the pattern element 10, in this example horizontal. A pattern jog 11 is required by optical proximity correction and this jog 11 will result in fracture elements 12 having a very small width 14. When masks are fabricated with the pattern shown in FIG. 1 using the vector scan electron beam writer resist scum will remain at the edge of the pattern element 10 in the narrow rectangle 12 adjacent to the pattern element.

FIG. 2 shows a pattern having pattern elements 22, 23, and 25 perpendicular to the fracture elements. In this example the pattern elements 22, 23, and 25 are vertical and the fracture elements are horizontal. This pattern layout and fracturing rules will cause fracture element ends 28 to contact part of the sides of the pattern elements 22, 23, and 25. These fracture element ends 28 will cause resist residue.

It is a principle objective of this invention to provide a method of forming a mask pattern using fracture elements which avoids the formation of resist residue.

It is another principle objective of this invention to provide a method of forming a mask using a mask pattern having fracture elements and a vector scan electron beam writer which avoids the formation of resist residue.

These objectives are achieved by the use of new pattern fracture rules. In these new pattern fracture rules special fracture elements are used along each side of the pattern elements. These special fracture elements are used for pattern elements parallel to and perpendicular to the fracture elements. The use of these special fracture elements prevent fracture element ends from contacting the sides of the pattern elements and avoids the formation of resist residue at the pattern edges.

BRIEF DESCRIPTION OF THE DRAWINGS

FIG. 1 shows a conventional fracture pattern for a mask pattern segment having pattern elements and fracture elements oriented in the same direction.

FIG. 2 shows a conventional fracture pattern for a mask pattern segment having pattern elements perpendicular to fracture elements.

DESCRIPTION OF THE PREFERRED EMBODIMENTS

Figure 3:
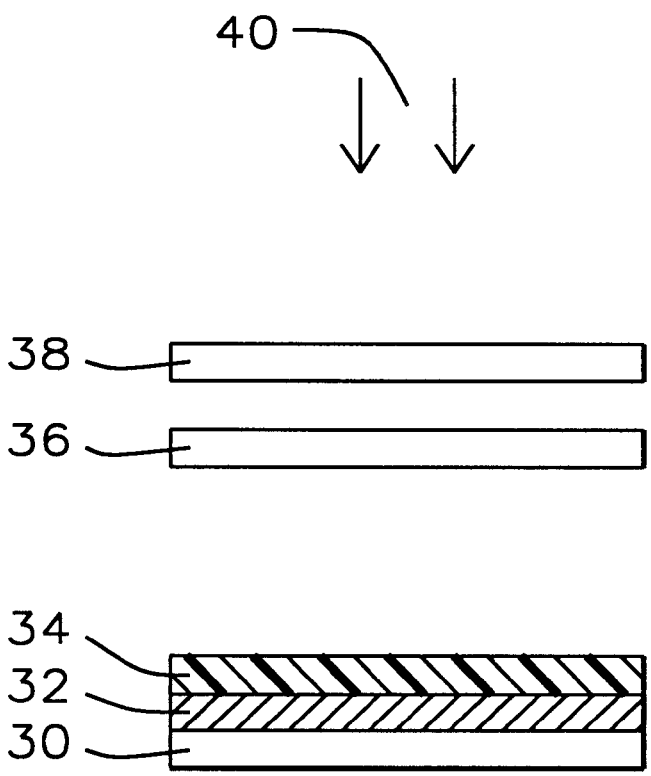
FIG. 3 shows a schematic view of a vector scan electron beam writer.
Figure 4:
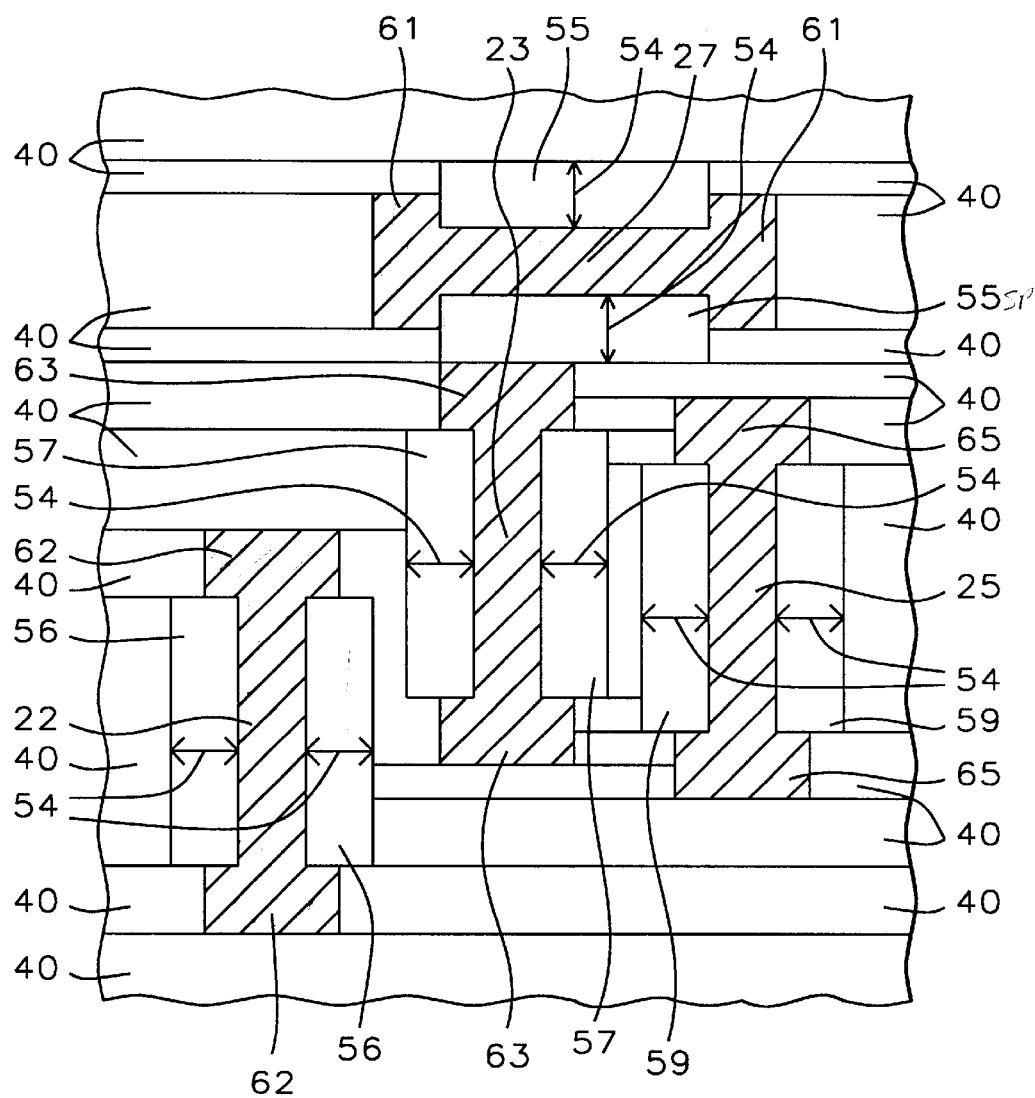
FIG. 4 shows the use of fracture patterns of this invention to form pattern segments perpendicular to and parallel to fracture elements.

Refer now to FIGS. 3 and 4 for the preferred embodiment of the methods of this invention for forming mask patterns and masks.

FIG. 4 shows a number of pattern elements 22, 23, and 25 oriented perpendicular to the orientation of the regular fracture elements 40 and a pattern element 27 oriented parallel to the orientation of the regular fracture elements 40. Optical proximity correction elements 61, 62, 63, and 65 are located at the ends of each of the pattern elements 22, 23, 25, and 27. FIG. 4 shows a number of special fracture elements 55, 56, 57, 59, and 61 each having a width 54 and having the same orientation as the pattern elements 22, 23, and 25. In this example the width 54 of the special fracture elements is between about 0.2 and 0.8 microns.

Two special fracture elements are associated with each pattern element, 55 with 27, 56 with 22, 57 with 23, and 59 with 25, and have the same length as that pattern element. Each pattern element is defined by the space between the two associated special fracture elements. Regular fracture elements are used to define the optical proximity correction elements 61, 62, 63, and 65. The special fracture elements prevent regular fracture element ends from contacting the sides of the pattern elements.

The method of forming a mask pattern having optical proximity correction proceeds by providing regular fracture elements having parallel long sides and special fracture elements 55, 56, 57, 59, and 61, wherein each of the special fracture elements are rectangles. The rectangular pattern elements 22, 23, 25, and 27 have a first end and a second end and are formed by means of arranging two of the special fracture elements so that said long sides of the two special fracture elements are parallel, the ends of the two special fracture elements are co-linear, and the two special fracture elements do not overlap. The optical proximity correction elements 61, 62, 63, and 65 are formed by arranging the regular fracture elements 40 to form optical proximity correction elements at each end of the rectangular pattern elements, as shown in FIG. 4.

FIG. 3 shows a schematic view of a vector scan electron beam writer. A transparent mask substrate 30, such as quartz, has a layer of opaque material 32, such as chrome, formed thereon. A layer of positive resist 34 is formed on the layer of opaque material. An electron beam 40 is directed through a number of apertures, 36 and 38, to expose the pattern elements on the layer of positive resist 30. The layer of positive resist is then developed to form a resist mask. The pattern element is then etched in the layer of opaque material 32 using the resist mask and standard etching methods.

While the invention has been particularly shown and described with reference to the preferred embodiments thereof, it will be understood by those skilled in the art that various changes in form and details may be made without departing from the spirit and scope of the invention.

What is claimed is:

1. A method of forming a mask pattern having optical proximity correction, comprising:
   providing regular fracture elements, wherein each of said regular fracture elements have long sides and a first end, and said long sides of all of said regular fracture elements are parallel;
   providing special fracture elements, wherein each of said special fracture elements are rectangles having parallel long sides a first distance apart, a first end, and a second end parallel to and a second distance away from said first end;
   forming rectangular pattern elements, each of said rectangular pattern elements having a first end and a second end, by means of arranging two of said special fracture elements so that said long sides of each of said two of said special fracture elements are parallel, said first ends of each of said two of said special fracture elements are co-linear, said second ends of each of said two of said special fracture elements are co-linear, and said two of said special fracture elements do not overlap; and
   arranging said regular fracture elements to form optical proximity correction elements at said first end and said second end of each of said rectangular pattern elements.

2. The method of claim 1 wherein said first distance is between about 0.2 and 0.8 microns.

3. The method of claim 1 wherein said optical proximity correction elements are rectangles.

4. The method of claim 1 further comprising providing a mask substrate, having a layer of opaque material and a layer of positive resist formed thereon, and using said special fracture elements, said regular fracture elements, and a vector scan type electron beam writer to expose said pattern element in said layer of positive resist.

5. The method of claim 1 wherein said long sides of said special fracture elements are perpendicular to said long sides of said regular fracture elements.

6. The method of claim 1 wherein said long sides of said special fracture elements are parallel to said long sides of said regular fracture elements.

7. The method of claim 1 wherein said long sides of some of said special fracture elements are perpendicular to said long sides of said regular fracture elements and said long sides of the remaining said special fracture elements are parallel to said long sides of said regular fracture elements.

8. A method of forming an optical proximity corrected mask, comprising:
   providing regular fracture elements, wherein each of said regular fracture elements have long sides and a first end, and said long sides of all of said regular fracture elements are parallel;
   providing special fracture elements, wherein each of said special fracture elements are rectangles having parallel long sides a first distance apart, a first end, and a second end parallel to and a second distance away from said first end;
   forming rectangular pattern elements, each of said rectangular pattern elements having a first end and a second end, by means of arranging two of said special fracture elements so that said long sides of each of said two of said special fracture elements are parallel, said first ends of each of said two of said special fracture elements are co-linear, said second ends of each of said two of said special fracture elements are co-linear, and said two of said special fracture elements do not overlap;
   arranging said regular fracture elements to form optical proximity correction elements at said first end and said second end of each of said rectangular pattern elements;
   providing a mask substrate having a layer of opaque material formed thereon;
   forming a layer of positive resist on said layer of opaque material;
   exposing said rectangular pattern elements and said optical correction elements on said layer of positive resist;
   developing said layer of resist;
   etching said pattern element in said layer opaque material using said developed layer of resist as a mask; and
   removing said layer of resist.

9. The method of claim 8 wherein said first distance is between about 0.2 and 0.8 microns.

10. The method of claim 8 wherein said optical proximity correction elements are rectangles.

11. The method of claim 8 wherein said long sides of said special fracture elements are perpendicular to said long sides of said regular fracture elements.

12. The method of claim 8 wherein said long sides of said special fracture elements are parallel to said long sides of said regular fracture elements.

13. The method of claim 8 wherein said long sides of some of said special fracture elements are perpendicular to said long sides of said regular fracture elements and said long sides of the remaining said special fracture elements are parallel to said long sides of said regular fracture elements.

14. The method of claim 8 wherein said exposing said rectangular pattern elements and said optical correction elements on said layer of positive resist uses a vector scan type electron beam writer.

* * * * *